United States Patent
Kermani et al.

(10) Patent No.: US 6,246,971 B1
(45) Date of Patent: Jun. 12, 2001

(54) TESTING ASYNCHRONOUS CIRCUITS

(75) Inventors: Bahram Ghaffarzadeh Kermani, Whitehall; William James Smurthwaite, Collegeville; James Frank Vomero, Catasauqua, all of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/225,654

(22) Filed: Jan. 5, 1999

(51) Int. Cl.$^7$ ............................................. G01R 31/26
(52) U.S. Cl. ..................................... 702/119; 340/514
(58) Field of Search ................................. 702/119, 118, 702/117, 123; 340/514; 438/14, 209, 719

(56) References Cited

U.S. PATENT DOCUMENTS

| | | | | |
|---|---|---|---|---|
| 3,873,818 | * | 3/1975 | Barnard ............................... | 235/153 |
| 3,976,940 | * | 8/1976 | Chau et al. ........................... | 324/73 |
| 4,764,925 | * | 8/1988 | Grimes et al. ....................... | 371/20 |
| 4,873,705 | * | 10/1989 | Johnson ............................... | 371/21.2 |
| 5,325,309 | * | 6/1994 | Halaviati et al. .................... | 703/15 |
| 5,355,369 | * | 10/1994 | Greenbergerl ..................... | 371/22.3 |
| 5,841,786 | * | 11/1998 | Keyes ................................. | 371/21.1 |
| 5,852,617 | * | 12/1998 | Mote, Jr. ............................. | 371/22.31 |

* cited by examiner

Primary Examiner—Marc S. Hoff
Assistant Examiner—Edward Raymond
(74) Attorney, Agent, or Firm—Duane Morris & Heckscher LLP

(57) ABSTRACT

A method and system for testing a circuit. A test program is downloaded into the circuit, which causes the circuit to provide a serial test output pattern comprising a series of identical signals to indicate whether the circuit passes the test. Signals of the test output pattern are compared against corresponding signals of an expected test output pattern only for non-masked signals of the expected test output pattern, wherein the expected test output pattern is masked for a maximum tolerable time period around an expected test output pattern start time.

17 Claims, 1 Drawing Sheet

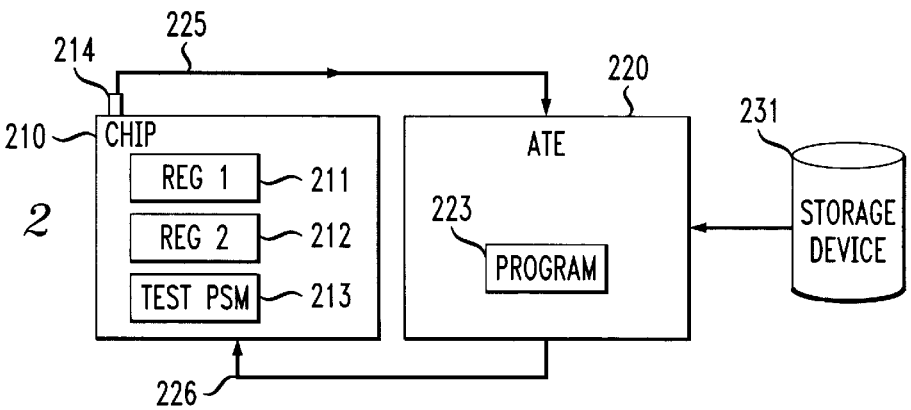

TESTING ASYNCHRONOUS CIRCUITS

BACKGROUND OF THE INVENTION

1. Field of the Invention

The present invention relates to testing integrated circuits (ICs) and, in particular, to automated test equipment (ATE) having improved testing of asynchronous circuits and systems in ICs.

2. Description of the Related Art

Thousands of ICs are often manufactured on a production line. There is a need to detect and reject defective chips, i.e. those that do not produce proper outputs for given inputs. One way to do this is to employ a personal computer (PC)-based testing program, which can be used to test a given chip, typically by applying test inputs to the chip and comparing actual outputs in response thereto to expected outputs. However, the PC-based testing process can be too slow for a mass production run or otherwise undesirable.

Manufactured ICs or chips are, therefore, typically tested by synchronous automated test equipment (an ATE or tester) to ensure the proper functioning of each chip. Typically, an ATE can automatically receive and test a chip in only a few seconds. This is done by the ATE receiving the next chip to be tested, and downloading into the chip a test program containing various test input vectors (applied stimulus) and expected outputs. After executing various instructions operating on the input vectors in accordance with the testing program, one or more outputs are produced, which are compared, typically by a digital signal processor (DSP) of the chip, to the expected output(s). If the results are as expected, the chip outputs a signal indicating "pass". Otherwise, the chip outputs a "fail" output signal. This signal may be detected by the tester and the chip rejected if a fail signal is detected.

Often such testing is done in accordance with IEEE Std 1149.1-1990 (JTAG) (see http://www.jtag.com or http://www.ieee.org), the so-called JTAG ("Joint Test Action Group") standard. Thus, each chip contains a special JTAG output pin or port, and the ATE is also JTAG-compatible. The ATE downloads a JTAG testing program into the chip to be tested. The chip then runs the JTAG testing program, which defines the testing procedure that the chip is to follow and the type of output that the chip is to generate in response to the test results. If the chip determines that the chip has passed the test, the chip outputs a special serial bit pattern or vector indicating "pass" on the JTAG output pin, and otherwise outputs a "fail" test output pattern. This pattern is sometimes referred to as a matching pattern or signature, which indicates "pass". For example, a matching pattern of 0xACED may be employed. The ATE, coupled to the chip's JTAG output pin, is synchronous and is designed to pass a chip under test only if an expected "pass" test output pattern is detected at a precisely predetermined time. Otherwise, the ATE rejects the chip as being defective.

Referring now to FIG. 1, there is shown a timing chart 100 showing illustrative test output comparisons for a prior art ATE. Timing chart 100 comprises row 111, which shows the expected test output pattern, which is expected to be output by the tested chip starting at precisely time $T_2$, if the chip passes the test. The exemplary test output pattern is LHLLHH, where "L" represents a low signal, and "H" represents a high signal. Thus, the JTAG test program causes the chip to run a testing program and to output the "pass" output pattern LHLLHH if the chip determines it has passed the test. The ATE expects this exact pattern, at precisely time $T_2$, in cases where the chip is operating properly.

Row 112 shows an example of an early actual test output pattern produced by the chip, which contains the appropriate "pass" test output pattern but which is output by the chip starting two clock cycles too early, at time $T_0$. Row 113 shows an example of a late actual test output pattern produced by the chip, which contains the appropriate "pass" test output pattern but which is output by the chip starting two clock cycles too late, at time $T_4$. Row 114 shows an example of an on-time actual test output pattern produced by the chip, which contains the appropriate "pass" test output pattern by the chip at exactly the expected time $T_2$.

As will be appreciated, the tester or ATE is configured to begin testing for identical bits of the expected test output pattern at time $T_2$. Before time $T_2$, no testing is done, and testing stops after time $T_7$. I.e., testing occurs only during the comparison time period from $T_2$ to $T_7$. If any actual output bit does not match the expected output bit in any of the time slots (clock cycles) of the comparison time period, the tester assumes that the "pass" test output pattern was not produced by the chip, and thus rejects the chip. For example, if a "fail" test output pattern is produced by the chip, or if the chip for any reason fails to output pass test output pattern, it will not match up with the expected output 111, even if timing is proper.

However, if early output 112 is produced, then at time $T_3$ a mismatch and thus failure will be detected, even though the chip did put out the appropriate test output pattern (albeit slightly too early) to indicate that it did pass the test. Alternatively, in differently-configured ATEs, a mismatch may be detected earlier, e.g. at times $T_0$ or $T_1$, if the actual "L" or "H" signals output in those time slots are recognized by the ATE as being different from the expected "no output" at those times slots (row 111).

Similarly, if late output 113 is produced, then at time $T_2$ a mismatch and thus failure will be detected, even though the chip did put out the appropriate test output pattern (albeit slightly too late) to indicate that it did pass the test.

In some cases, when the appropriate pass test output pattern is output by the chip but it does not start at exactly the expected clock cycle, the detection of a failure can be considered to be a false failure, because although the chip produced a test output pattern slightly too early or too late, the earliness or lateness is not so extreme that the chip, in actual implementation in a larger system, would cause errors or failure. For example, a chip that produces the correct test output pattern or vector on time (row 114), two cycles too early (row 112), or two cycles too late (row 113) may still function acceptably when integrated into a system. Therefore, the foregoing testing devices and procedures sometimes cause functional chips to be falsely rejected, leading to inefficient use of resources.

SUMMARY

In the present invention, a method and system are provided for testing a circuit. A test program is downloaded into the circuit, which causes the circuit to provide a serial test output pattern comprising a series of identical signals to indicate whether the circuit passes the test. Signals of the test output pattern are compared against corresponding signals of an expected test output pattern only for non-masked signals of the expected test output pattern, wherein the expected test output pattern is masked for a maximum tolerable time period around an expected test output pattern start time.

BRIEF DESCRIPTION OF THE DRAWINGS

FIG. 1 is a timing chart showing illustrative test output comparisons for a prior art ATE;

FIG. 2 is a block diagram of an ATE chip testing system, in accordance with an embodiment of the present invention; and FIG. 3 is a timing chart showing illustrative test output comparisons showing the operation of various embodiments of the ATE system of FIG. 2.

DESCRIPTION OF THE PREFERRED EMBODIMENT

As explained previously, the use of ATE is often desirable in testing chips, due to its automation and comparatively high speed. Such systems, however, are typically inflexible because they employ a predetermined set of inputs and expected responses, where the expected responses include the precise time at which the response is expected. For example, a JTAG test program including a couple million instructions may be downloaded into the chip over a period corresponding to a few million clock cycles. At the end of this several million cycle period, at a precise clock cycle ("expected start time") an ideally-operating chip is expected to start producing a series of bits that comprise a "pass" test output pattern or vector. The expected test output pattern and expected start time are typically determined by a simulator program which simulates the operation of an "ideal" or representative version of the chip to be tested. However, because of the extreme complexity of some ICs, and because some of the chip's internal circuitry may be asynchronous, the expected start time may not be precisely matched by every IC or chip. For example, some chips may have circuits with asynchronous interfaces (such as asynchronous arbiters), synchronous interfaces between synchronous modules with different frequencies and/or phases, or long delays in some of the signals. Thus, some properly functioning chips may well produce the proper output but a few cycles earlier or later than other properly functioning chips, due to the extreme complexity of the chip and instructions executed during the testing program. I.e., some chips that produce the proper test output pattern slightly early or late can function within acceptable limits when implemented in a real system.

In the present invention, the ATE runs a modified ATE program, which causes a modified JTAG test program to be loaded into the chip. The modified JTAG test program causes the chip to output a test output pattern consisting of either all 1s or all 0's at the end of the testing procedure. The modified ATE program also causes the ATE to mask the expected output test vector during a time window before and after the expected start time, so that acceptably early or late pass outputs do not cause a failure to be detected by the ATE. Thus, the expected output test vector is masked to the maximum tolerable time shift. As will be appreciated, to mask a bit of the expected output test vector, i.e. to mask the expected output test vector for a given clock cycle or time slot, means that ATE does not perform any comparison between the expected output test vector and the actual output test vector during that time. Alternatively, a masked bit ("X") may be considered to be a "don't care" where any comparison of an actual bit with a mask X does not result in a mismatch being detected. These features and other advantages of the present invention are described in further detail below with reference to FIGS. 2 and 3.

Referring now to FIG. 2, there is shown a block diagram of an ATE chip testing system 200, in accordance with an embodiment of the present invention. System 200 comprises ATE 220, chip 210, and storage device 231. ATE 220 runs ATE program 223, and chip 210 has JTAG output pin 214 and registers 211, 212, and runs JTAG test program 213. Storage device 231 may be a hard disk drive of a computer such as a work station, and can store a program or other information to be accessed by ATE 220. In one embodiment, a program is stored in storage device 231, which is designed to modify the characteristics of ATE 220 to implement the present invention. Thus, in operation, ATE receives program 223 from storage device 231, and thereafter runs program 223. Program 223 causes ATE to load test program 213 into chip 210, and also causes ATE 220 to compare the chip's JTAG output with the expected output in accordance with the present invention. A user may change the program in storage device 231 to cause ATE 220 to function differently, for example if a different type chip is to be tested or if the time shift tolerance is to be modified.

In particular, JTAG test program 213 causes chip 210 to output on JTAG port 214 a series of consecutive H's if pass is determined, and a series of L's otherwise. (In an alternative embodiment, a series of L's can represent pass. In another alternative embodiment, a series of H's is output in the event the test is passed but no output is provided if the test is not passed.) In one embodiment, the series of output H's in the event of a pass may be implemented by chip 210 setting a device output pin to H at the end of the test if the test is passed, otherwise leaving the output pin at the default value (typically 0 or L).

Second, before the comparison test period (which begins at time $T_4$) and for a number of initial clock cycles of the comparison test period (i.e., an initial portion of the comparison test period), the expected output bits (e.g., the series of H's expected in case of pass) are "masked," where no comparison during a clock cycle whenever an expected output bit is masked. This allows output test vectors indicating "pass" to be detected as a pass by ATE 220 even if they are too early or too late, within a predetermined time tolerance, as explained in further detail below. Referring now to FIG. 3, there is shown a timing chart 300 showing illustrative test output comparisons showing the operation of various embodiments of ATE system 200 of FIG. 2. Timing chart 300 comprises row 311, which shows the expected test output vector, which is expected to be output by the tested chip 210 starting at precisely time $T_4$ (the expected start time), if chip 210 passes the test. In one embodiment, the test output pattern expected for "pass" is a series of at least 6 H signals, during the comparison time period from $T_4$ to $T_9$, preceded by all L signals at time $T_3$ and previous time slots. Row 312 shows an example of an early actual test output pattern produced by chip 210, which contains the appropriate "pass" test output pattern but which is output by chip 210 starting two clock cycles too early, at time $T_2$. Row 313 shows an example of a late actual test output pattern produced by chip 210, which contains the appropriate "pass" test output pattern but which is output by chip 210 starting two clock cycles too late, at time $T_6$.

In one embodiment, it is determined empirically or heuristically how much time difference can be tolerated while allowing a chip producing the proper test output pattern to be considered to be operational or functional. For example, it may be determined that a chip that produces the proper test output pattern up to two time slots early or late is still functional, but that more than three time slots of delay or earliness is intolerable. (In alternative embodiments, a different amount of earliness may be tolerated than tardiness; for example, a proper test output vector up to three time slots earlier than the expected time may be tolerable but only up to two time slots later may be tolerated.)

In the example illustrated in rows 311, 312, and 313, if an early actual output 312 is received from a functional chip, within the tolerable time limits, then if an expected output vector such as illustrated in row 311 is employed, then a failure will be indicated at time $T_2$, since there will be a mismatch between the early H signal in row 312 and the expected L signal in row 311 at time $T_2$. Similarly, if a late actual output 313 is received from a functional chip, within the tolerable time limits, if the expected output vector of row 311 is employed, then a failure will be indicated at time $T_4$, since there will be a mismatch between the late L signal in row 313 and the expected H signal in row 311 at time $T_4$.

Therefore, instead of a conventional expected output vector such as illustrated in row 311, an expected output vector with some portion thereof masked is employed, as shown in rows 314, 315, 316, to address the foregoing false rejection problem. In one embodiment, as illustrated in row 314, ATE 220 masks the expected output test vector during a time window before the expected start time, so that acceptably early pass outputs do not cause a failure to be detected. Row 314 shows an expected output vector similar to that of row 311, but having the default output time slots (the time slots before the expected start time) masked (indicated by the symbol "X" in FIG. 3). Whenever the expected output vector has a mask value X, ATE 220 does not compare the actual JTAG output signal and thus will not detect a failure in the case of early output row 312. At times $T_2$ and $T_3$, the early test output pattern or vector 312 is H instead of L, but it is not yet compared to the expected "L" of the expected output vector since it is masked. At time $T_4$, the masking of row 314 stops and ATE 220 does compare the corresponding bits of the expected output vector 314 with that of early test output vector 312, but by this time the bits match and no mismatch and thus no failure will be detected by ATE 220.

In another embodiment, as illustrated in row 315, ATE 220 masks the expected output test vector during a time window both before and after the expected start time, so that acceptably early or late pass outputs do not cause a failure to be detected. Row 315 shows an expected output vector similar to that of row 311, but having the default output time slots (the time slots before the expected start time) masked, and also two time slots into the comparison time period masked. I.e., at times before expected start time $T_4$ and also at time slots $T_4$ and $T_5$, the expected output vector shown in row 311 is masked, as illustrated in row 315. Thus, ATE 220 does not compare the actual test output pattern to the corresponding bits of the expected vector until time $T_6$. This allows both early and late actual output patterns 312, 313 to not be rejected. However if an actual test output pattern is more than three time slots too late, then a mismatch will be detected at time $T_6$.

In one embodiment, all times preceding the expected start time are masked, as shown in rows 314 and 315, since an early output may be easier to tolerate than a late output. In an alternative embodiment, only a defined number of time slots preceding the expected start time are masked, so that an actual test output pattern that is too early will indicate a test failure.

In another embodiment of the present invention, as illustrated in row 316, ATE 220 masks all of the expected output test vector until the very last time slot of the comparison test period, to allow the maximum tolerance of lateness in actual test output patterns.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A method for testing a circuit, comprising the steps of:
   (a) downloading a test program into the circuit for causing the circuit to provide a serial test output pattern comprising a series of identical signals to indicate whether the circuit passes the test; and
   (b) comparing signals of the test output pattern against corresponding signals of an expected test output pattern only for non-masked signals of the expected test output pattern, wherein the expected test output pattern is masked for a maximum tolerable time period around an expected test output pattern start time.

2. The method of claim 1, wherein the test program is a JTAG-compatible test program, steps (a) and (b) are performed by a JTAG-compatible tester, and the circuit is part of an integrated circuit having a JTAG output port for providing the serial test output pattern to the tester.

3. The method of claim 1, wherein:
   the expected test output pattern comprises a series of high signals during a comparison time period beginning at the expected test output pattern start time; and
   the serial test output pattern comprises a series of high signals if the circuit passes the test.

4. The method of claim 1, further comprising the step of determining the expected test output pattern start time with a simulator program that simulates the operation of a representative version of the circuit.

5. The method of claim 1, wherein the maximum tolerable time period corresponds to acceptable time delays of the circuit when the circuit is implemented in a real system.

6. The method of claim 1, wherein the maximum tolerable time period comprises a first time period before the expected test output pattern start time and a second time period after the expected test output pattern start time.

7. The method of claim 6, wherein the second time period is shorter in duration than the first time period.

8. The method of claim 1, wherein:
   the expected test output pattern comprises a series of identical signals during a comparison time period beginning at the expected test output pattern start time; and
   the maximum tolerable time period comprises the comparison time period except for a last time slot of the comparison time period.

9. A tester for testing a circuit, comprising:
   (a) means for downloading a test program into the circuit for causing the circuit to provide a serial test output pattern comprising a series of identical signals to indicate whether the circuit passes the test; and
   (b) means for comparing signals of the test output pattern against corresponding signals of an expected test output pattern only for non-masked signals of the expected test output pattern, wherein the expected test output pattern is masked for a maximum tolerable time period around an expected test output pattern start time.

10. The tester of claim 9, wherein the test program is a JTAG-compatible test program, the tester is a JTAG-compatible tester, and the circuit is part of an integrated circuit having a JTAG output port for providing the serial test output pattern to the tester.

11. The tester of claim 9, wherein:
   the expected test output pattern comprises a series of high signals during a comparison time period beginning at the expected test output pattern start time; and the serial test output pattern comprises a series of high signals if the circuit passes the test.

12. The tester of claim 9, wherein the expected test output pattern start time is determined with a simulator program that simulates the operation of a representative version of the circuit.

13. The tester of claim 9, wherein the maximum tolerable time period corresponds to acceptable time delays of the circuit when the circuit is implemented in a real system.

14. The tester of claim 9, wherein the maximum tolerable time period comprises a first time period before the expected test output pattern start time and a second time period after the expected test output pattern start time.

15. The tester of claim 14, wherein the second time period is shorter in duration than the first time period.

16. The tester of claim 9, wherein:

the expected test output pattern comprises a series of identical signals during a comparison time period beginning at the expected test output pattern start time; and the maximum tolerable time period comprises the comparison time period except for a last time slot of the comparison time period.

17. The tester of claim 9, further comprising a storage device having stored thereon a program for causing the tester to perform the functions of means (a) and (b).

* * * * *